United States Patent
Cole et al.

(10) Patent No.: US 7,276,285 B2
(45) Date of Patent: Oct. 2, 2007

(54) NANOTUBE FABRICATION BASIS

(75) Inventors: Barrett E. Cole, Bloomington, MN (US); Robert E. Higashi, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 375 days.

(21) Appl. No.: 10/749,637

(22) Filed: Dec. 31, 2003

(65) Prior Publication Data
US 2005/0145601 A1 Jul. 7, 2005

(51) Int. Cl.
*B32B 9/00* (2006.01)
(52) U.S. Cl. ...... 428/408; 977/742
(58) Field of Classification Search ...... 428/408; 257/310; 430/313; 438/689, 96
See application file for complete search history.

(56) References Cited

U.S. PATENT DOCUMENTS

| 5,187,557 | A | * | 2/1993 | Zenke | 257/310 |
| 5,710,656 | A | * | 1/1998 | Goossen | 359/291 |
| 6,143,474 | A | * | 11/2000 | Shen et al. | 430/313 |
| 6,268,615 | B1 | * | 7/2001 | Liu et al. | 257/30 |
| 6,339,281 | B2 | * | 1/2002 | Lee et al. | 313/309 |
| 6,346,189 | B1 | | 2/2002 | Dai et al. | |
| 6,401,526 | B1 | | 6/2002 | Dai et al. | |
| 6,528,020 | B1 | | 3/2003 | Dai et al. | |
| 6,890,233 | B2 | * | 5/2005 | Hsu | 445/24 |
| 2002/0024099 | A1 | | 2/2002 | Watanabe et al. | |
| 2003/0173985 | A1 | | 9/2003 | Cole et al. | |
| 2004/0161929 | A1 | * | 8/2004 | Son et al. | 438/689 |

FOREIGN PATENT DOCUMENTS

| EP | 1061043 | 12/2000 |
| FR | 2832995 | 6/2003 |
| JP | 0308162 | 3/2003 |

* cited by examiner

*Primary Examiner*—Jennifer McNeil
*Assistant Examiner*—Daniel Miller
(74) *Attorney, Agent, or Firm*—Kris T. Fredrick

(57) ABSTRACT

A structure having a substrate, patterned metal layer and a catalyst island formed on the metal layer. The surface of the substrate upon which the metal layer is formed may be oxidized. As an illustrative example, the metal may be HfN and the catalyst island may be iron, nickel, or the like. The resulting structure may be placed in an environment having a carbon-containing gas, a temperature between 500 and 1200 degrees C., and an electric field. A nanotube may grow from the catalyst island. A method including the combining of hafnium and nitrogen may be used to make the nanotube growing structure.

16 Claims, 5 Drawing Sheets

NANOTUBE FABRICATION BASIS

BACKGROUND

The present invention relates to a deposition of material and particularly to high temperature deposition of metal on a wafer. More particularly it relates to such deposition for the fabrication of nanotubes.

Carbon nanotubes are a recent technological development. They may be hollow graphite tubules. In an isolated form, individual nanotubes may be useful for making microscopic electrical, mechanical and electromechanical devices. Single-walled nanotubes (SWNTs) are desirable. However, obtaining high quality, single-walled nanotubes has been generally a difficult task. Existing methods for the production of nanotubes often yield bundled forms of tangled and often multi-walled nanotubes. Such tangled nanotubes are very difficult to isolate into discrete elements for use in the fabrication of various electronic and/or devices.

SUMMARY

Development of a method, material and apparatus useful under high temperatures is needed for easy and reliable growth of carbon nanotubes (CNTs). The formation of nano islands is usually required to promote growth of SWNTs. Nano islands are typically formed by annealing a thin catalytic metal to a high temperature (i.e., 900 to 1000 degrees C.). Typically the formation of nanotubes by a high temperature anneal, leaves conductive islands but no macroscopic conductive path to permit external electrical contact to the nanotube. The use of another metal, typically forms an alloy with the catalytic metal preventing the formation of islands. Alternately, a metal can be applied to the nanotubes after growth but this process involves both pre-and post-CNT growth processing. The present invention solves these problems and meets those objectives. Metal islands having a particular material formed with an appropriate conducting metal have been developed to support the successful growth of nanotubes on a resulting structure for a reliable electrical connection to the nanotubes.

DESCRIPTION

The development and application of a metal capable of withstanding deposition temperatures around 900 degrees Centigrade (C) that may be incorporated in metal islands for the growth of carbon nanotubes is one aspect of the present invention. To grow a carbon nanotube, it may be important to form metal islands to support the catalytic growth. The islands may be formed by exposing a thin metal such an iron (Fe) to high temperatures in an inert environment. At these high temperatures, the thin metal may ball up to form islands of a diameter on the order of the thickness. Small islands may yield single wall small diameter nanotubes. To make contact to these islands may require a patternable conducting metal. Most metals, such as aluminum (Al), that are used to form electrical connections, cannot withstand high temperatures. Many metals that can withstand high temperatures may anneal with other metals when exposed to high temperatures and thus prevent island formation.

A solution may be taking hafnium (Hf) metal, depositing it, and annealing it in nitrogen ($N_2$). The result may be HfN. This material may be conductive and support the formation of Fe and nickel (Ni) islands with a 900 degree C. inert anneal. Other catalyst metals may include, but are not limited to, molybdenum, cobalt, ruthenium, zinc and oxides of the metals. The catalyst materials may also include various alloys or mixtures of these metals including Fe and Ni, such as Mo—Fe. Carbon nanotubes may be formed on these structures. Briefly in sum, the Hf metal may be deposited and annealed in $N_2$ after patterning. Then a thin Fe or other catalytic metal may be deposited and patterned. This metal may be annealed in an inert environment to form islands on the HfN metal conductor lead material. The conductor material may be $Hf_xN_{1-x}$ metal having a resistance between 10 ohms/sq and 10 Kohm/square. The present HfN is not a typical stoichiometric HfN. However, the HfN may be stoichiometric or non-stoichiometric. Other lead material may include, but are not limited to, Hf, transition metal nitrides, including ZrN, TaN, TiN, HfN, other conductive metals, Hf, conductive metals and oxides of the metals. The material may be ITO or some other conductive oxide.

Figure 1:
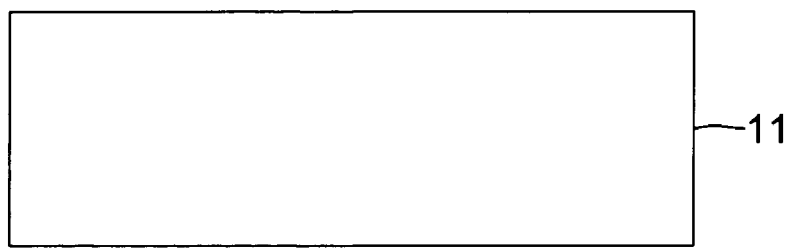
FIG. 1 is a wafer or substrate upon which the invention is made.
Figure 2:
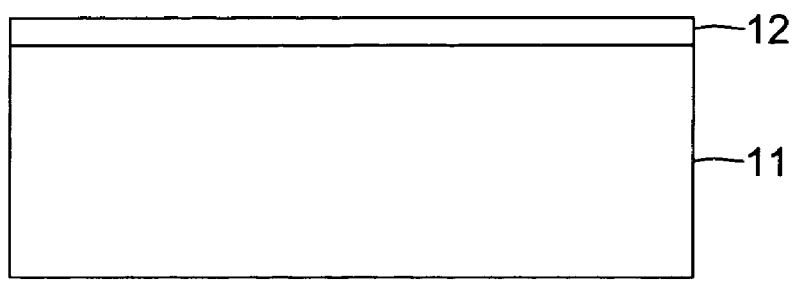
FIG. 2 shows an oxide layer on the substrate.
Figure 3:
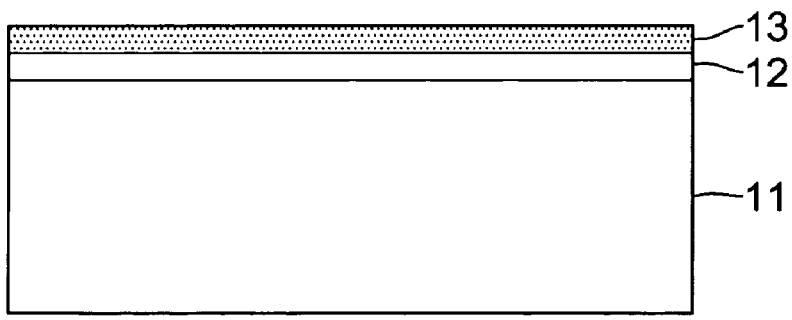
FIG. 3 reveals a layer of a conductive material on the oxide layer.
Figure 4:
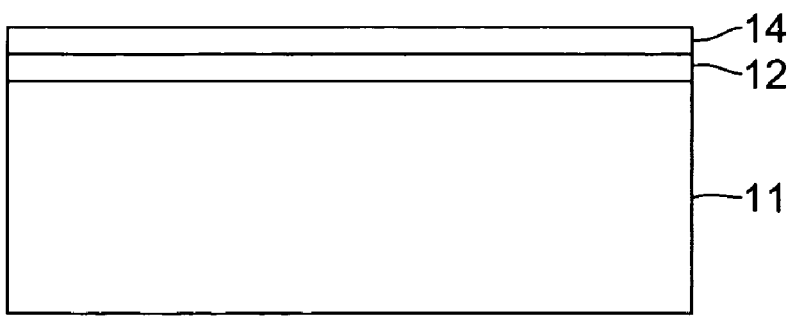
FIG. 4 shows the layer of the conductive material of FIG. 3 after its annealing in a gas.
Figure 5A:
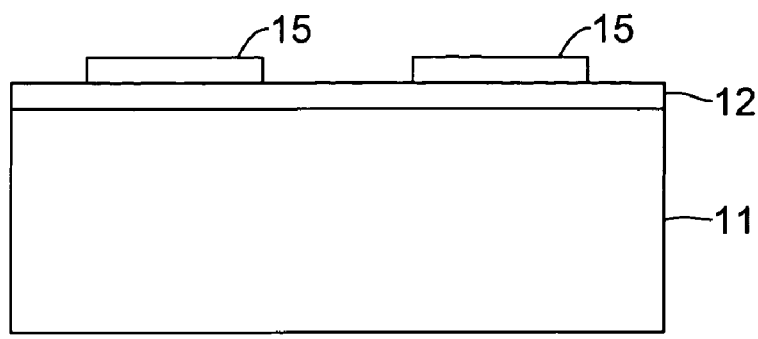
FIGS. 5a and 5b show cross-sectional and plan views, respectively, of the patterned portions of the annealed conductive layer of FIG. 4.
Figure 5B:
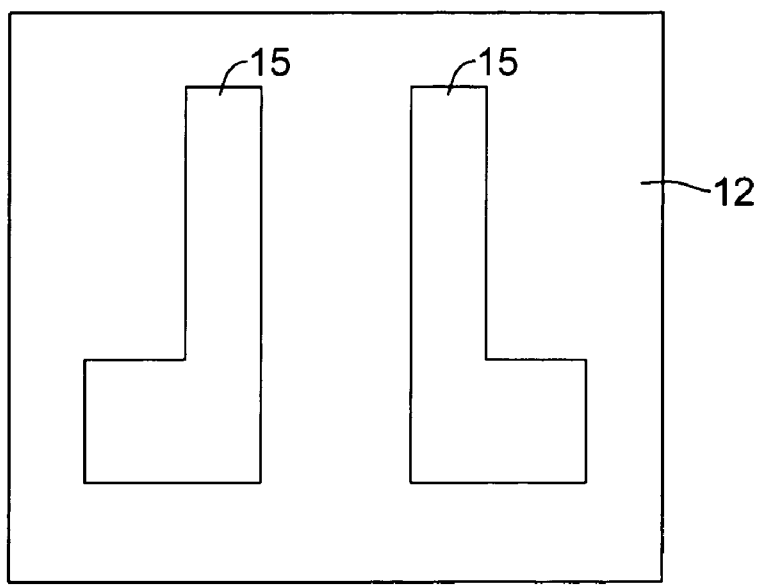
Figure 6A:
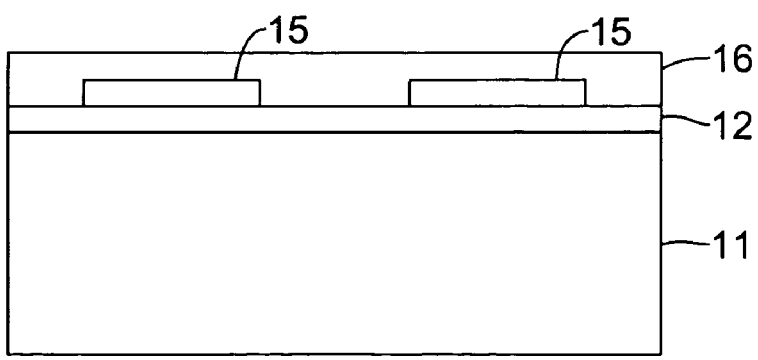
FIGS. 6a and 6b show the passivation of the patterned portions of FIGS. 5a and 5b.
Figure 6B:
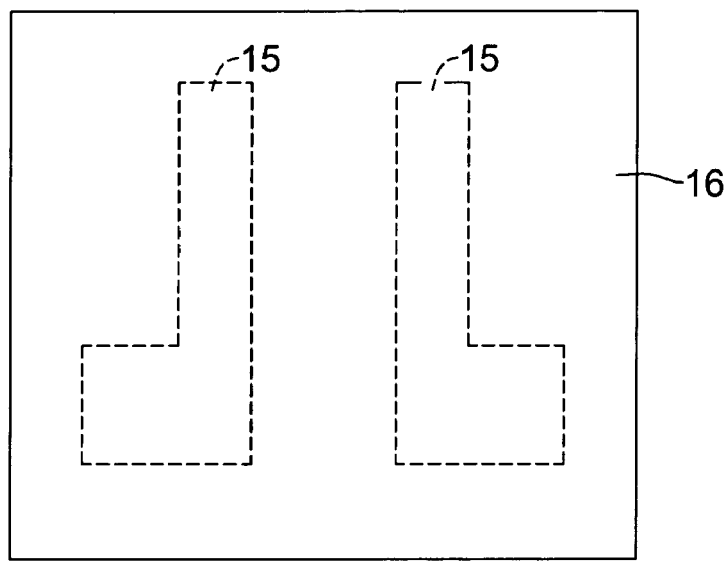
Figure 7A:
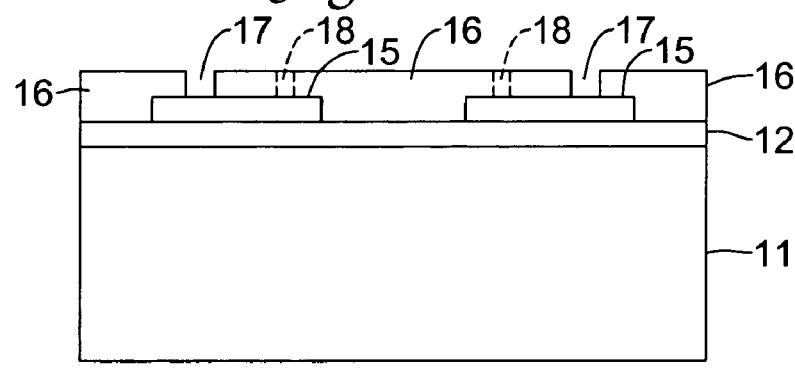
FIGS. 7a and 7b reveal sectional and top views of vias through the passivation layer to the patterned portions.
Figure 7B:
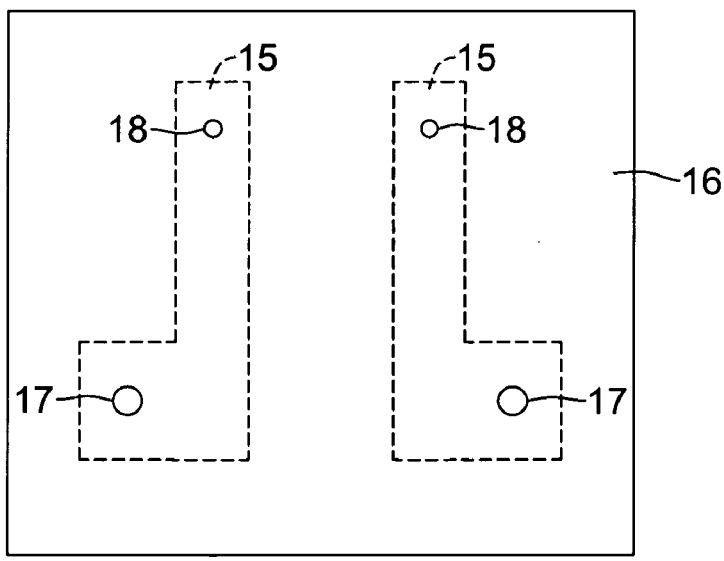

For an illustrative embodiment, one may start with silicon (Si) wafer 11, as in FIG. 1. (The figures referred to in the present description are not necessarily made to scale.) Other wafer or other substrate materials that may be selected include, but are not limited to, silica, quartz, silicon nitride, sapphire and alumina. A thermal oxide ($SiO_2$) 12 may be grown on wafer 11, as indicated in FIG. 2. Substrate 11 may be substituted for layer 12. Oxide 12 may have a thickness of about or greater than 1000 angstroms. In lieu of the oxide, another insulative or semi-insulative material may be used as a layer 12. Next, in FIG. 3, a layer of Hf material 13 may be deposited on $SiO_2$ layer 12. The thickness of the layer of Hf material 13 may be between 500 and 1000 angstroms. Then the Hf material 13 may be annealed in an $N_2$ environment for about two hours at a temperature of 400 to 450 degrees C. However, the time duration may be longer or shorter and the temperature may be as low as 300 degrees C. or it may be greater than 450 degrees C. Also, another gas may be used for annealing. This should result in a layer 14 of HfN, as in FIG. 4. HfN layer 14 may be patterned as conductor strips 15 for external connections. Cross-sectional and plan views are shown in FIGS. 5a and 5b, respectively. The resultant exposed materials, that is, a portion of layer 12 and HfN conductor strips 15 on the wafer, may be passivated with a layer 16, for example, silicon nitride or the like, such as other passivation materials. Passivation layer 16 is shown in the cross-sectional and plan views of FIGS. 6a and 6b. Then vias 17 may be etched or cut through passivation layer 16 to HfN strips 15, for external conductor 25 connections. Also, vias 18 may be etched or cut through passivation layer 16 to HfN conducting strips 15 for connection to catalyst islands 21 of FIG. 9. Vias 17 and 18, shown in FIGS. 7a and 7b, may be made with for example a plasma etch.

Figure 8:
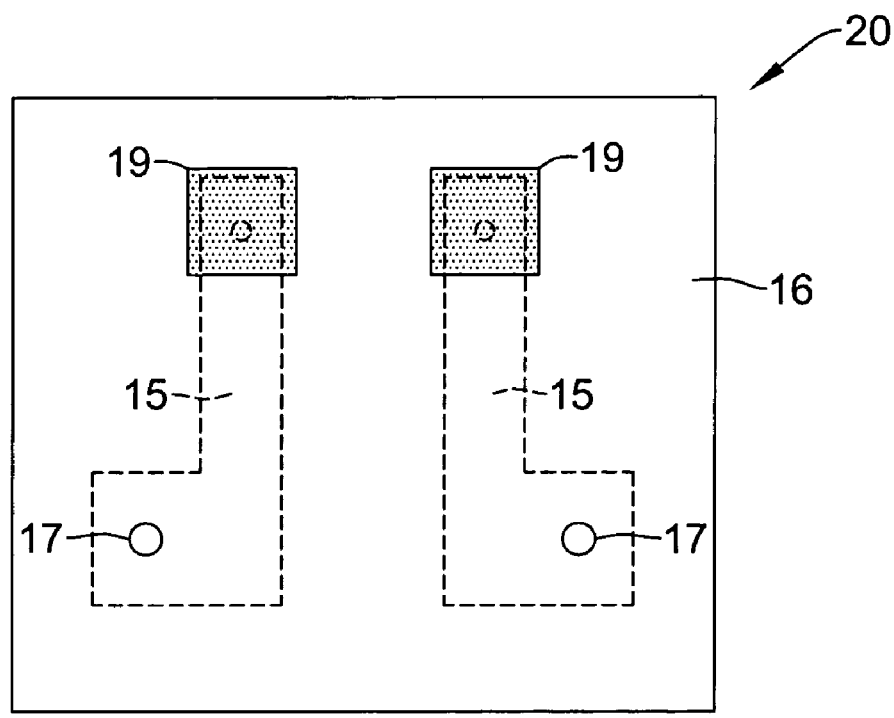
FIG. 8 shows patterned portions of a catalyst layer.
Figure 9:
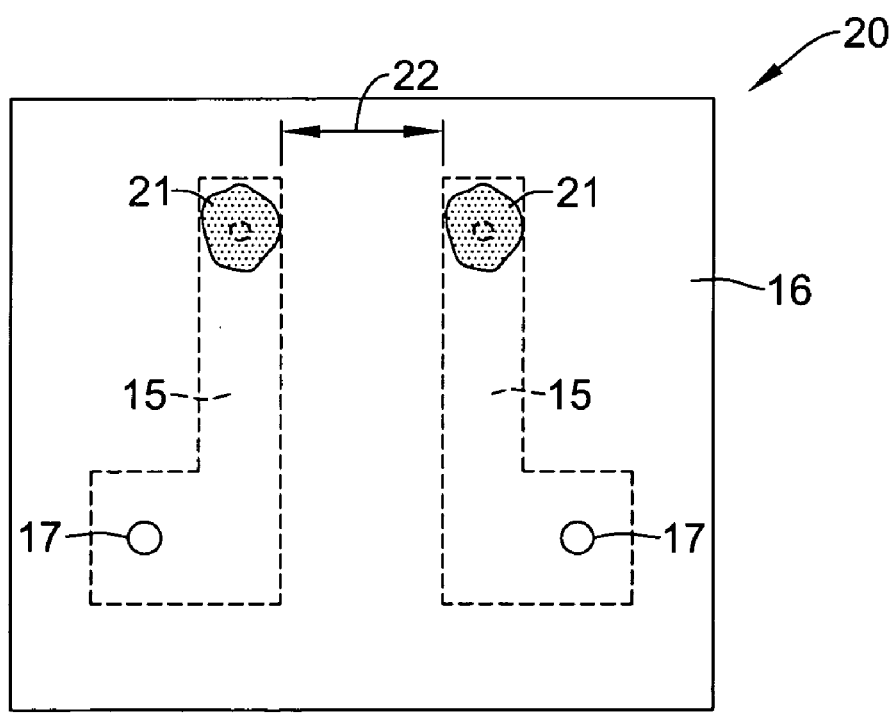
FIG. 9 reveals the annealing of the catalyst portions into islands.

A thin catalyst layer 19, such as Ni or Fe may be deposited on and in vias 18 to an exposed portion of HfN strip 15 at room temperature, such as with sputtering. Other appropriate materials may instead be deposited. That layer 19 of catalyst material may be between 50 and 100 angstroms thick. Then, the catalyst may be patterned with liftoff or by milling to result in catalyst portions 19, as indicated in FIG. 8. Afterwards, the patterned catalyst deposited layer 19 may be annealed in a forming gas composed of about 15 percent of hydrogen and 85 percent of nitrogen, for about 30 minutes at about 900 degrees C. However, various gases and mixtures at a temperature with a range between 500 and 1200 degrees for a period ranging between 15 minutes and two hours may suffice for annealing. This annealing may form an island 21 of each catalyst material portion 19, as illustrated in FIG. 9. Also, during the annealing, structure 20 may be purged of gases such as oxygen.

Figure 10:
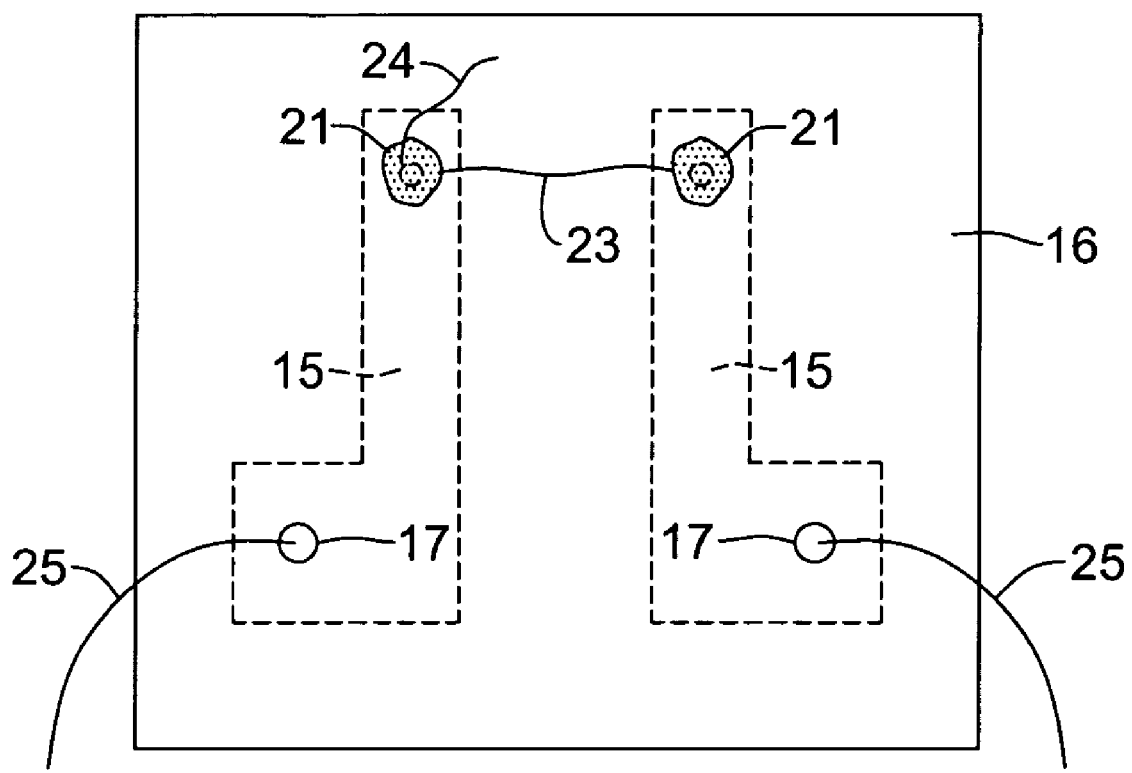
FIG. 10 shows external conductor connections and illustrates the growing of nanotubes.

After the annealing, the gas may be switched to methane (at a rate of 1700 or 850 sccm) and $H_2$ (at a rate of 1700 or 850 sccm) for a growing of a carbon nanotube. Other carbon-containing gases may be used in lieu of methane. (The abbreviation "sccm" means standard cubic centimeters per minute. "Standard" means that the measurement is referenced to zero degrees C. at 760 Torr, i.e., 1 atm pressure.) Methane may be also mixed in with the forming gas at a ratio of one to one at about 1000 sccm. The flow rates may be other than stated here for satisfactory annealing and growing nanotubes. An electric field of about one volt per micron of gap 22 (in FIG. 9) may be applied during the growing of the nanotubes. For instance, a bridging of a 10 micron gap with a growing nanotube would use a 10 volt electric field. Other electric field intensities may be incorporated. As a result, a nanotube 23 may be grown connecting two islands 21, as illustrated in FIG. 10. Or an unconnected nanotube 24 may be grown for one purpose or another. Conductors 25 may be bonded, soldered, or attached in some fashion to HfN conducting strips 15, respectively.

Although the invention has been described with respect to at least one illustrative embodiment, many variations and modifications will become apparent to those skilled in the art upon reading the present specification. It is therefore the intention that the appended claims be interpreted as broadly as possible in view of the prior art to include all such variations and modifications.

What is claimed is:

1. A structure comprising:
   a substrate;
   an oxide layer on the substrate;
   an HfN layer on the oxide layer;
   a passivation layer on the HfN layer, having at least one via through the passivation layer to the HfN; and
   a catalyst island formed on the at least one via connected to the HfN layer, wherein the catalyst island is formed by exposing catalytic material to a temperature sufficient to form a ball having a diameter and a thickness, wherein the diameter is similar to the thickness.

2. The structure of claim 1, wherein the catalyst island is configured to withstand an environment having a carbon-containing gas, a temperature greater than 500 degrees C. and an electric field.

3. The structure of claim 2, wherein the catalyst island is adapted to withstand the environment until a desired nanotube is grown.

4. A structure comprising:
   a substrate;
   an insulating layer on the substrate;
   an HfN layer on the insulating layer;
   a protective layer on the HfN layer; and
   at least one catalyst island in contact with the HfN layer, wherein the catalyst island is formed by exposing catalytic material to a temperature sufficient to form a ball having a diameter and a thickness, wherein the diameter is similar to the thickness.

5. The structure of claim 4, wherein the catalyst comprises at least one metal selected from a group consisting of iron, nickel, cobalt, zinc, molybdenum, ruthenium and oxides thereof.

6. The structure of claim 5, wherein the catalyst island is adapted to withstand being placed in an environment comprising:
   a carbon-containing gas;
   an electric field; and
   a temperature greater than 500 degrees C.

7. The structure of claim 6, maintaining the environment until a nanotube is grown.

8. An apparatus comprising:
   an insulating substrate;
   a conductive material deposited on the substrate;
   a passivation material deposited on the conductive material, wherein one or more vias are formed through the passivation material to the conductive material; and
   an island of a catalytic material formed in and on the vias to the conductive material, wherein the island of catalytic material is formed by exposing the catalytic material to a temperature sufficient to form a ball having a diameter and a thickness, wherein the diameter is similar to the thickness.

9. The apparatus of claim 8, wherein the conductive material is selected from a group of transition metal nitrides, ZrN, TaN, TiN, HfN, conductive nitrides, Hf, conductive metals and oxides thereof.

10. The apparatus of claim 9, wherein the conductive material is stoichiometric.

11. The apparatus of claim 9, wherein the conductive material is non-stoichiometric.

12. The apparatus of claim 9, wherein the catalytic material is selected from a group of Fe, nickel, molybdenum, cobalt, ruthenium, zinc, and oxides, alloys and mixtures thereof.

13. The apparatus of claim 9, wherein the conductive material is ITO.

14. The apparatus of claim 9, wherein the conductive material is a conductive oxide.

15. The apparatus of claim 12, wherein the substrate comprises a material selected from a group of silicon, silica, quartz, silicon nitride, sapphire, and alumina.

16. The apparatus of claim 15, further comprising a nanotube extending from the island.

* * * * *